(12) United States Patent
Okazaki

(10) Patent No.: US 11,342,240 B2
(45) Date of Patent: May 24, 2022

(54) SEMICONDUCTOR DEVICE

(71) Applicant: Mitsubishi Electric Corporation, Tokyo (JP)

(72) Inventor: Hiroyuki Okazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/981,180

(22) PCT Filed: Jul. 12, 2018

(86) PCT No.: PCT/JP2018/026336
§ 371 (c)(1),
(2) Date: Sep. 15, 2020

(87) PCT Pub. No.: WO2020/012604
PCT Pub. Date: Jan. 16, 2020

(65) Prior Publication Data
US 2021/0005525 A1    Jan. 7, 2021

(51) Int. Cl.
*H01L 23/31*   (2006.01)
*H01L 23/373*  (2006.01)
(Continued)

(52) U.S. Cl.
CPC .......... *H01L 23/3192* (2013.01); *H01L 23/29* (2013.01); *H01L 23/3121* (2013.01);
(Continued)

(58) Field of Classification Search
CPC ... H01L 23/3192; H01L 23/373; H01L 24/16; H01L 2224/13023; H01L 2224/13144;
(Continued)

(56) References Cited

U.S. PATENT DOCUMENTS 7,622,804 B2 * 11/2009 Hasegawa ........... H01L 23/3135
257/666
2010/0096717 A1 * 4/2010 Uchida ............ H01L 27/14683
257/434
(Continued)

FOREIGN PATENT DOCUMENTS

JP    2010-109011 A    5/2010
JP    2011-054806 A    3/2011
JP    2017-168486 A    9/2017

OTHER PUBLICATIONS

International Search Report; Written Opinion; and Notification of Transmittal of the International Search Report and the Written Opinion of the International Searching Authority, or the Declaration issued in PCT/JP2018/026336; dated Aug. 28, 2018.

*Primary Examiner* — Ahmed N Sefer
(74) *Attorney, Agent, or Firm* — Studebaker & Brackett PC

(57) ABSTRACT

A transistor chip (2) has an active region (7). A first seal material (5) covers a central portion of the active region (7) and does not cover a peripheral portion of the active region (7). A second seal material (6) covers the peripheral portion of the active region (7). Thermal conductivity of the first seal material (5) is higher than thermal conductivity of the second seal material (6). Permittivity of the second seal material (6) is lower than permittivity of the first seal material (5).

5 Claims, 5 Drawing Sheets

(51) Int. Cl.

| | |
|---|---|
| *H01L 23/00* | (2006.01) |
| *H01L 23/367* | (2006.01) |
| *H01L 23/36* | (2006.01) |
| *H01L 23/48* | (2006.01) |
| *H01L 23/29* | (2006.01) |
| *H01L 23/60* | (2006.01) |

(52) U.S. Cl.
CPC .......... *H01L 23/3135* (2013.01); *H01L 23/36* (2013.01); *H01L 23/367* (2013.01); *H01L 23/373* (2013.01); *H01L 23/3733* (2013.01); *H01L 23/3735* (2013.01); *H01L 23/48* (2013.01); *H01L 23/60* (2013.01); *H01L 24/10* (2013.01); *H01L 24/16* (2013.01)

(58) Field of Classification Search
CPC ... H01L 2224/1329; H01L 2224/13386; H01L 2224/16058; H01L 2224/16245; H01L 23/3121; H01L 23/3135; H01L 23/36; H01L 23/3735; H01L 23/48; H01L 23/3733; H01L 23/29; H01L 23/367; H01L 23/60; H01L 24/10
See application file for complete search history.

(56) References Cited

U.S. PATENT DOCUMENTS

| | | |
|---|---|---|
| 2010/0102461 A1 | 4/2010 | Miyagawa et al. |
| 2011/0049701 A1 | 3/2011 | Miyagawa |
| 2015/0243576 A1* | 8/2015 | Miyakoshi .......... H01L 23/3135 361/717 |

* cited by examiner

SEMICONDUCTOR DEVICE

FIELD

The present disclosure relates to a semiconductor device wherein a transistor chip is covered with a seal material.

BACKGROUND

In a semiconductor device, to secure reliability without degrading characteristics of a transistor and an MMIC, a ceramic package or a multilayer wiring structure is used. However, process cost and material cost of a ceramic package are high. Further, there is a case where a molded package is used to manufacture an element at tow cost (see, for example, PTL 1). In a conventional molded package, an entire area of a transistor chip is covered with a seal material having high heat resistance and high moisture resistance.

CITATION LIST

Patent Literature

[PTL 1] JP 2017-168486 A

SUMMARY

Technical Problem

If a seal material having high thermal conductivity is used to improve heat dissipation, there is a problem that source-drain capacitance Cds increases, and high-frequency characteristics such as efficiency and gain degrade. Meanwhile, if a seal material having low permittivity is used to suppress degradation of the high-frequency characteristics, there is a problem that heat dissipation is lowered, and reliability cannot be secured.

The present invention has been made to solve the problems as described above, and an object of the present invention is to provide a semiconductor device which is capable of suppressing degradation of high-frequency characteristics while securing reliability.

Solution to Problem

A semiconductor device according to the present disclosure includes: a transistor chip having an active region; a first seal material covering a central portion of the active region and not covering a peripheral portion of the active region; and a second seal material covering the peripheral portion of the active region, wherein thermal conductivity of the first seal material is higher than thermal conductivity of the second seal material, and permittivity of the second seal material is lower than permittivity of the first seal material.

Advantageous Effects of Invention

In the present disclosure, the central portion of the active region of the transistor chip which is a portion where heat generation concentrates is covered with the first seal material having high thermal conductivity. By this means, because heat dissipation is improved, it is possible to secure reliability. Further, the peripheral portion of the active region where a temperature is relatively low is not covered with the first seal material having high permittivity, but covered with the second seal material having low permittivity. By this means, because it is possible to suppress source-drain capacitance, it is possible to suppress degradation of high-frequency characteristics.

DESCRIPTION OF EMBODIMENTS

A semiconductor device according to the embodiments of the present disclosure will be described with reference to the drawings. The same components will be denoted by the same symbols, and the repeated description thereof may be omitted.

Embodiment 1

Figure 1:
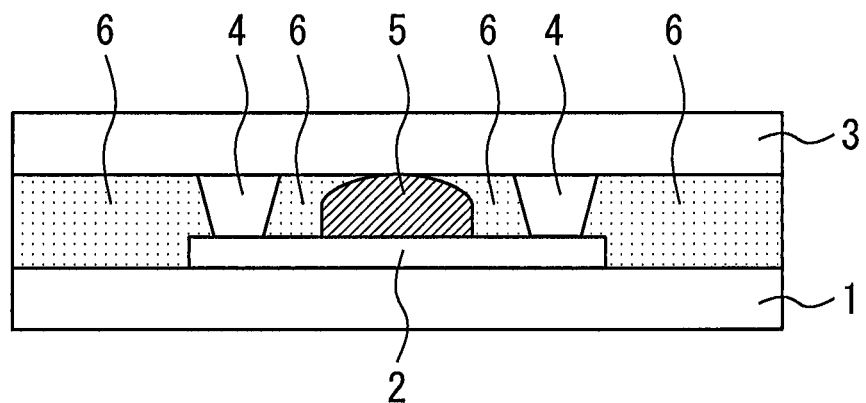
FIG. 1 is a cross-sectional diagram illustrating a semiconductor device according to Embodiment 1.

FIG. 1 is a cross-sectional diagram illustrating a semiconductor device according to Embodiment 1. A transistor chip 2 is flip-chip bonded on a substrate 1. The transistor chip 2 is a field-effect transistor such as a gallium nitride-based HEMT which excels in high-frequency characteristics and high heat dissipation. A heat dissipation substrate 3 with high heat dissipation including Cu, Au, or the like, is positioned above the transistor chip 2. The transistor chip 2 is electrically connected to the heat dissipation substrate 3 with an Au bump 4. Note that, in a case where flip-chip bonding is not used, a wire bond may be used in place of the Au bump 4.

Between the substrate 1 and the heat dissipation substrate 3, a central portion of the transistor chip 2 is sealed with a first seal material 5, and other regions are sealed with a second seal material 6. Thermal conductivity of the first seal material 5 is higher than thermal conductivity of the second seal material 6. Permittivity of the second seal material 6 is lower than permittivity of the first seal material 5.

The first seal material 5 and the second seal material 6 are not limited to a resin, and may be an insulating film, or the like. For example, the first seal material 5 is a mold resin (thermal conductivity: approximately 4 F/m, permittivity: approximately 0.8 W/mK), or the like. The second seal material 6 is polyimide (thermal conductivity: approximately 2 F/m, permittivity: approximately 0.18 W/mK), or the like. Note that the mold resin is typically a seal material which is made by combining a silica filler, an epoxy resin, and a curing agent. While the silica filler accounts for approximately 75%, characteristics as the mold resin change depending on a type of the epoxy resin which accounts for approximately 20%. There are various types of the epoxy resin including, for example, an OCN epoxy resin, a biphenyl epoxy resin, a multifunctional epoxy resin, or the like.

Heat generated during operation of the transistor chip 2 is dissipated through the heat dissipation substrate 3 from an upper surface side of the transistor chip 2. The substrate 1 is a PKG substrate bonded to a lower surface of the transistor chip 2 using a die bond, or the like. The substrate 1 may be a substrate which is similar to the heat dissipation substrate 3, and preferably has high heat dissipation.

Figure 2:
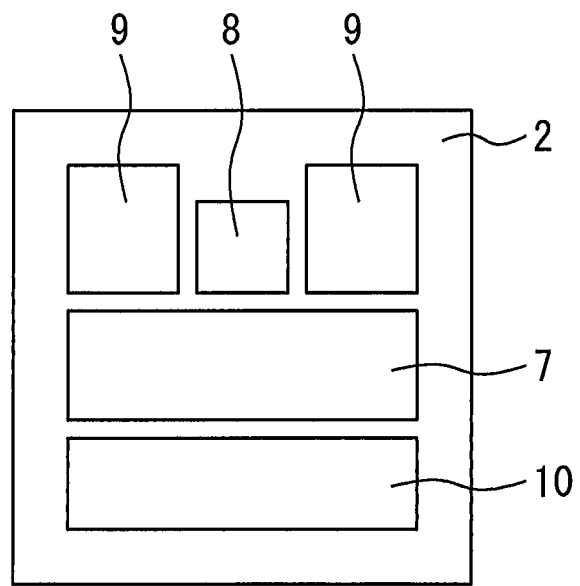
FIG. 2 is a top view illustrating the transistor chip.

FIG. 2 is a top view illustrating the transistor chip. The transistor chip 2 includes an active region 7, a gate pad 8, a source pad 9 and a drain pad 10. At least one of the gate pad 8, the source pad 9 and the drain pad 10 is connected to the heat dissipation substrate 3 with the Au bump 4. Which pad is connected changes depending on customer demand, or the like.

Figure 3:
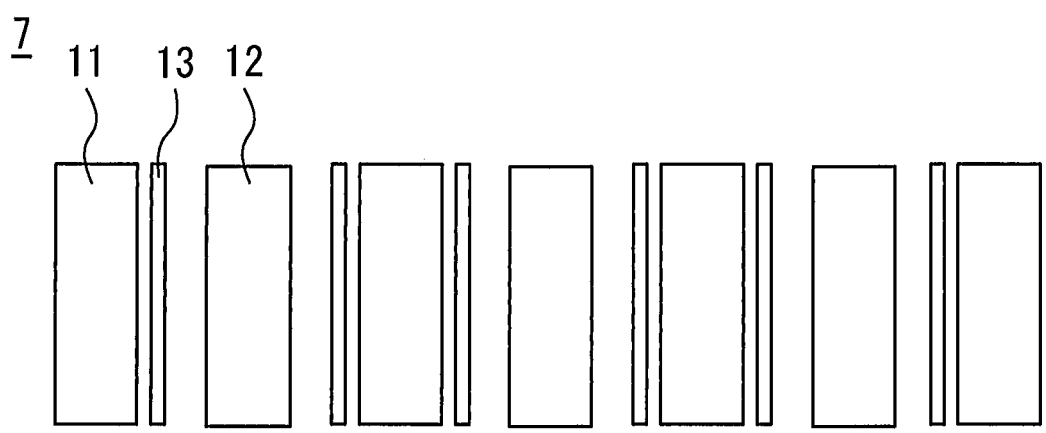
FIG. 3 is a top view illustrating the active region of the transistor chip.

FIG. 3 is a top view illustrating the active region of the transistor chip. A plurality of source electrodes 11 and a plurality of drain electrodes 12 are alternately positioned, and between them, a plurality of gate electrodes 13 are positioned. The gate electrodes 13 are connected to the gate pad 8. The source electrodes 11 are connected to the source pad 9. The drain electrodes 12 are connected to the drain pad 10.

Figure 4:
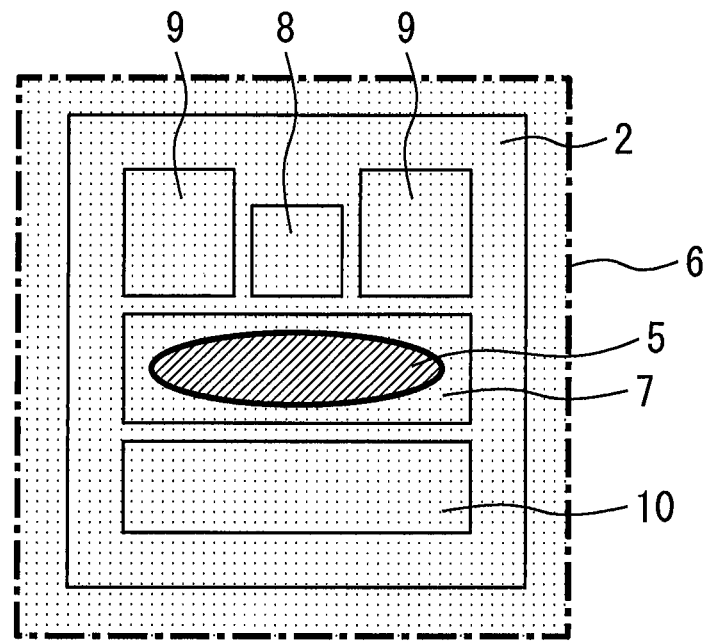
FIG. 4 is a top view illustrating a state where the transistor chip according to Embodiment 1 is sealed.
Figure 5:
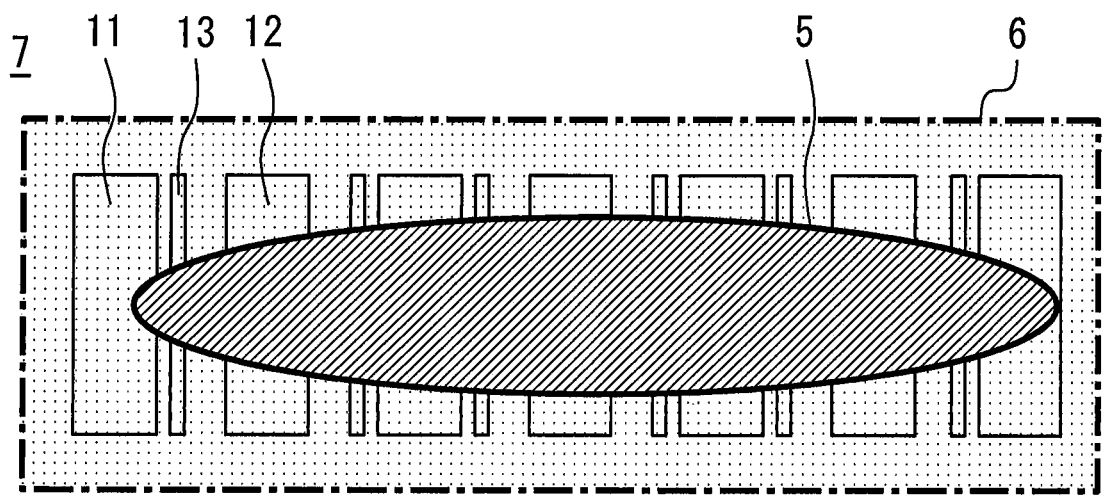
FIG. 5 is a top view illustrating a state where the active region of the transistor chip according to Embodiment 1 is sealed.

FIG. 4 is a top view illustrating a state where the transistor chip according to Embodiment 1 is sealed. FIG. 5 is a top view illustrating a state where the active region of the transistor chip according to Embodiment 1 is sealed. Heat distribution of the transistor chip 2 circularly expands from the center of the active region. Therefore, a central portion of the active region 7 is covered with the first seal material 5 having high thermal conductivity. A peripheral portion of the active region 7 is covered with the second seal material 6 having low permittivity.

For example, the first seal material 5 and the second seal material 6 can be applied upon PKG mounting. First, the first seal material 5 is circularly applied to the central portion of the active region 7. Such application can be easily performed, and can be also manually performed. Then, the transistor chip 2 is joined to the heat dissipation substrate 3 with the Au bump 4. Then, the entire area of the transistor chip 2 is filled with the second seal material 6.

Alternatively, it is also possible to apply the first seal material 5 and the second seal material 6 through a transfer process during a wafer process. The transfer process is a photoengraving process using a mask. Specifically, first, after a resin is applied to the entire surface of a wafer, a resist is applied. Then, an opening is formed using a mask at a portion of the resist where the resin is not required. Then, patterning is performed on the resin through wet etching or dry etching using the resist as a mask. Finally, the resist is removed. Because, in the present embodiment, the first seal material 5 is only circularly applied to the central portion of the active region 7, it is only necessary to use a simple mask whose resolution is not high, and the present embodiment can be implemented through an easy transfer process having a low overlay accuracy.

As described above, in the present embodiment, the central portion of the active region of the transistor chip 2 which is a portion where heat generation concentrates is covered with the first seal material 5 having high thermal conductivity. By this means, because heat dissipation is improved, it is possible to secure reliability. Further, the peripheral portion of the active region where a temperature is relatively low is not covered with the first seal material 5 having high permittivity, but covered with the second seal material 6 having low permittivity. By this means, because it is possible to suppress source-drain capacitance Cds, it is possible to suppress degradation of high-frequency characteristics.

Further, the first seal material 5 and the second seal material 6 may be applied either upon PKG mounting or during a wafer process. In either case, it is possible to easily apply the first seal material 5 and the second seal material 6 through an existing process without using a complicated pattern.

Because the heat dissipation substrate 3 is provided on the first seal material 5 and the second seal material 6, heat is dissipated also from an upper surface side as well as from a lower surface side of the device. Further, because the first seal material 5 is in contact with the heat dissipation substrate 3, heat dissipation from the transistor chip 2 to the heat dissipation substrate 3 becomes high. Further, because the transistor chip 2 is connected to the heat dissipation substrate 3 with the Au bump 4, heat is also dissipated through the Au bump 4.

Embodiment 2

Figure 6:
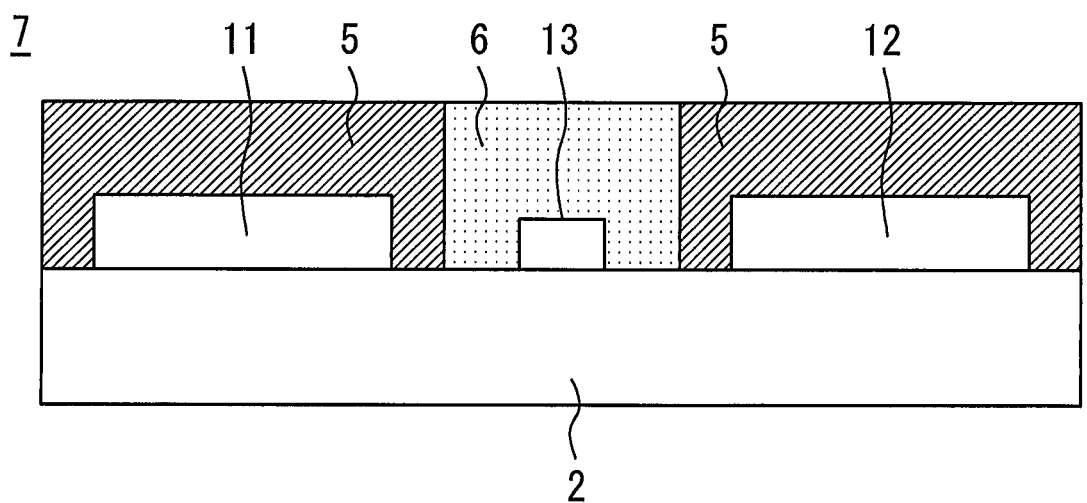
FIG. 6 is a cross-sectional diagram illustrating a state where an active region of a transistor chip according to Embodiment 2 is sealed.
Figure 7:
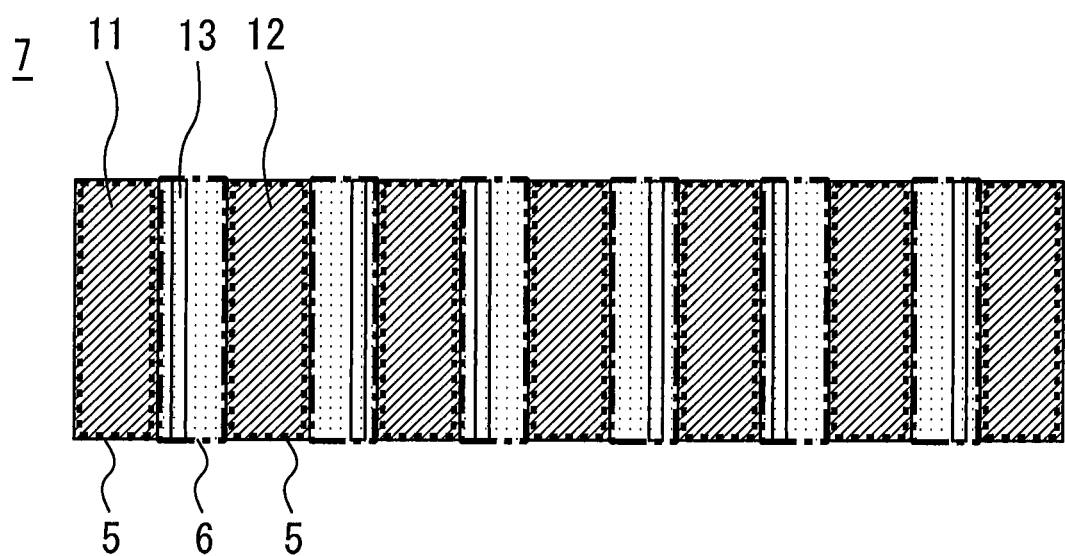
FIG. 7 is a top view illustrating a state where the active region of the transistor chip according to Embodiment 2 is sealed.

FIG. 6 is a cross-sectional diagram illustrating a state where an active region of a transistor chip according to Embodiment 2 is sealed. FIG. 7 is a top view illustrating a state where the active region of the transistor chip according to Embodiment 2 is sealed. It is possible to suppress degradation of high-frequency characteristics by covering a portion around the gate electrode 13, which is considered to contribute most to increase of source-drain capacitance Cds, with the second seal material 6 having low permittivity. Further, because heat dissipation is improved by covering portions around the source electrode 11 and the drain electrode 12 which are ohmic electrodes with a large area with the first seal material 5 having high thermal conductivity, it is possible to secure reliability. Other components are similar to those in Embodiment 1.

Embodiment 3

Figure 8:
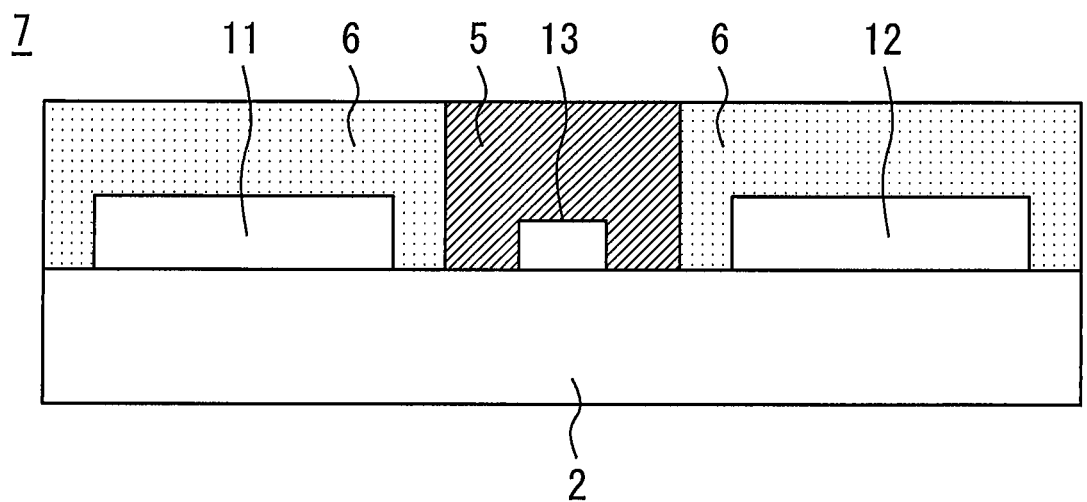
FIG. 8 is a cross-sectional diagram illustrating a state where an active region of a transistor chip according to Embodiment 3 is sealed.
Figure 9:
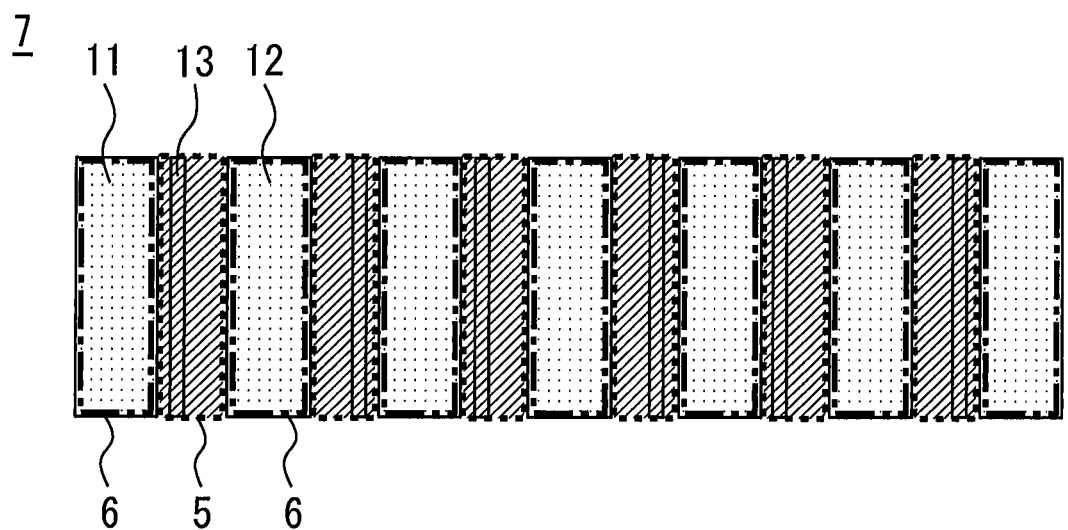
FIG. 9 is a top view illustrating a state where the active region of the transistor chip according to Embodiment 3 is sealed.

FIG. 8 is a cross-sectional diagram illustrating a state where an active region of a transistor chip according to Embodiment 3 is sealed. FIG. 9 is a top view illustrating a state where the active region of the transistor chip according to Embodiment 3 is sealed. Because heat dissipation is improved by covering a portion around the gate electrode 13 which is a heat generation source with the first seal material 5 having high thermal conductivity, it is possible to secure reliability. Further, because it is possible to suppress source-drain capacitance Cds by covering portions around the source electrode 11 and the drain electrode 12 with the second seal characteristics. Other components are similar to those in Embodiment 1.

Note that it is difficult to selectively apply the first seal material 5 and the second seal material 6 in Embodiments 2 and 3 upon PKG mounting. Therefore, the first seal material 5 and the second seal material 6 are applied by adding one or two transfer processes during a wafer process.

REFERENCE SIGNS LIST 2 transistor chip; 3 heat dissipation substrate; 4 Au bump; 5 first seal material; 6 second seal material; 7 active region; 11 source electrode; 12 drain electrode; 13 gate electrode

The invention claimed is:
1. A semiconductor device comprising:
a transistor chip having an active region;
a first seal material covering a central portion of the active region and not covering a peripheral portion of the active region; and
a second seal material covering the peripheral portion of the active region,
wherein thermal conductivity of the first seal material is higher than thermal conductivity of the second seal material, and
permittivity of the second seal material is lower than permittivity of the first seal material.

2. The semiconductor device according to claim 1, further comprising a heat dissipation substrate provided on the first seal material and the second seal material.

3. The semiconductor device according to claim 2, wherein the first seal material is in contact with the heat dissipation substrate.

4. The semiconductor device according to claim 3, wherein the transistor chip is connected to the heat dissipation substrate with a bump.

5. The semiconductor device according to claim 2, wherein the transistor chip is connected to the heat dissipation substrate with a bump.

* * * * *